United States Patent
Han et al.

(10) Patent No.: US 11,134,334 B2
(45) Date of Patent: Sep. 28, 2021

(54) SOUNDING DEVICE, MANUFACTURING METHOD THEREOF AND DISPLAY DEVICE

(71) Applicant: BOE TECHNOLOGY GROUP CO., LTD., Beijing (CN)

(72) Inventors: Yanling Han, Beijing (CN); Xue Dong, Beijing (CN); Haisheng Wang, Beijing (CN); Yingming Liu, Beijing (CN); Lijun Zhao, Beijing (CN); Chenyang Zhang, Beijing (CN); Peixiao Li, Beijing (CN); Yuzhen Guo, Beijing (CN); Xiufeng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 134 days.

(21) Appl. No.: 16/529,132

(22) Filed: Aug. 1, 2019

(65) Prior Publication Data
US 2020/0213712 A1    Jul. 2, 2020

(30) Foreign Application Priority Data
Jan. 2, 2019  (CN) .......................... 201910002464.9

(51) Int. Cl.
*H04R 17/00*    (2006.01)
*H04R 1/28*    (2006.01)
(Continued)

(52) U.S. Cl.
CPC ......... *H04R 1/2807* (2013.01); *H01L 41/081* (2013.01); *H01L 41/0973* (2013.01); *H04R 2217/03* (2013.01)

(58) Field of Classification Search
CPC .. H04R 17/00; H04R 17/005; H04R 2499/15; H01L 41/311
See application file for complete search history.

(56) References Cited

U.S. PATENT DOCUMENTS 6,545,384 B1 * 4/2003 Pelrine ................. F04B 43/043
                                                          310/309
7,100,254 B2   9/2006 Tanikawa et al.
(Continued)

FOREIGN PATENT DOCUMENTS

| CN | 1256663 A | 6/2000 |
|---|---|---|
| CN | 107511318 A | 12/2017 |
| CN | 109068245 A | 12/2018 |

OTHER PUBLICATIONS

Chinese Office Action in Chinese Application No. 201910002464.9, dated Jan. 14, 2021 with English translation.
(Continued)

*Primary Examiner* — Ryan Robinson
(74) *Attorney, Agent, or Firm* — Collard & Roe, P.C.

(57) ABSTRACT

A sounding device, a manufacturing method thereof and a display device are provided. The sounding device includes at least two sounding units. Each of the sounding units includes: a transparent structural layer, including a recess and a supporting member located around the recess; and a piezoelectric vibrating film covering the recess, a cavity is formed by the piezoelectric vibrating film and the supporting member. The piezoelectric vibrating film includes a base film covering the recess; and at least one piezoelectric structure located on a side of the cavity away from the transparent structural layer. Each of the at least one piezoelectric structure includes: a first electrode; a piezoelectric material layer located on a side of the first electrode away from the cavity; and a second electrode located on a side of the piezoelectric material layer away from the first electrode.

18 Claims, 8 Drawing Sheets

200

(51) Int. Cl.
*H01L 41/09* (2006.01)
*H01L 41/08* (2006.01)

(56) References Cited

U.S. PATENT DOCUMENTS

| | | | | |
|---|---|---|---|---|
| 7,141,915 | B2* | 11/2006 | Takeuchi | B81B 3/0018 |
| | | | | 310/328 |
| 9,820,055 | B2* | 11/2017 | Babayoff | H04R 3/00 |
| 10,271,154 | B2* | 4/2019 | Bocko | H04R 5/04 |
| 10,478,858 | B2* | 11/2019 | Lasiter | G06F 3/0412 |
| 10,497,747 | B2* | 12/2019 | Tsai | H01L 27/20 |
| 10,497,748 | B2* | 12/2019 | Panchawagh | H01L 27/1214 |
| 10,542,235 | B2* | 1/2020 | Shin | H04N 5/642 |
| 10,569,302 | B2* | 2/2020 | Sammoura | G06F 3/043 |
| 10,618,079 | B2* | 4/2020 | Kidwell, Jr. | B06B 1/0622 |
| 10,627,943 | B2* | 4/2020 | Ding | G06F 3/0412 |
| 10,762,320 | B2* | 9/2020 | Kho | H04R 7/045 |
| 2012/0269372 | A1 | 10/2012 | Martin et al. | |
| 2016/0018893 | A1* | 1/2016 | Choi | G06F 3/041 |
| | | | | 345/177 |
| 2020/0171540 | A1* | 6/2020 | Han | B06B 1/0607 |
| 2020/0209973 | A1* | 7/2020 | Kim | G06F 3/016 |
| 2020/0314515 | A1* | 10/2020 | Jang | G06F 3/016 |
| 2020/0413202 | A1* | 12/2020 | Kusano | H04R 31/00 |

OTHER PUBLICATIONS

Chinese Office Action in Chinese Application No. 201910002464.9, dated Jun. 9, 2021 with English translation.

* cited by examiner

SOUNDING DEVICE, MANUFACTURING METHOD THEREOF AND DISPLAY DEVICE

The application claims priority to the Chinese patent application No. 201910002464.9 filed on Jan. 2, 2019, the entire disclosure of which is incorporated herein by reference as part of the present application.

TECHNICAL FIELD

Embodiments of the present disclosure relate to a sounding device, a manufacturing method thereof and a display device.

BACKGROUND

In recent years, with booming development of the market of smart display devices such as mobile phone and tablet computer, people have increasingly stricter requirements on a screen-to-body ratio of the smart display device. Therefore, miniaturization and integration of components in the smart display device, except a display panel, have gradually become research hotspots of major manufacturers.

Generally, a sounding device is a device which moves the air by generating a mechanic vibration, so as to cause a fluctuation of the air medium, thereby converting an electrical energy to a kinetic energy and then to a sound wave. The sounding device is one of important components in the smart display device.

SUMMARY

Embodiments of the present disclosure provide a sounding device, a manufacturing method thereof and a display device. The sounding device includes at least two sounding units. Each of the sounding units includes: a transparent structural layer, including a recess and a supporting member located around the recess; and a piezoelectric vibrating film covering the recess, a cavity is formed by the piezoelectric vibrating film and the supporting member. The piezoelectric vibrating film includes a base film covering the recess; and at least one piezoelectric structure located on a side of the cavity away from the transparent structural layer. Each of the at least one piezoelectric structure includes: a first electrode located on a side of the cavity away from the transparent structural layer; a piezoelectric material layer located on a side of the first electrode away from the cavity; and a second electrode located on a side of the piezoelectric material layer away from the first electrode. In this way, the sounding device can be implemented as a light and thin, transparent sounding device, so as to be integrated in a display device.

At least one embodiment of the present disclosure provides a sounding device, including at least two sounding units. Each of the sounding units includes: a transparent structural layer including a recess and a supporting member located around the recess; and a piezoelectric vibrating film covering the recess, a cavity is formed by the piezoelectric vibrating film and the supporting member. The piezoelectric vibrating film includes: a base film covering the recess; and at least one piezoelectric structure located on a side of the cavity away from the transparent structural layer. Each of the at least one piezoelectric structure includes: a first electrode located on a side of the cavity away from the transparent structural layer; a piezoelectric material layer located on a side of the first electrode away from the cavity; and a second electrode located on a side of the piezoelectric material layer away from the first electrode.

For example, in the sounding device provided by an embodiment of the present disclosure, an orthographic projection of the first electrode on the transparent structural layer is at least partly overlapped with an orthographic projection of the recess on the transparent structural layer.

For example, in the sounding device provided by an embodiment of the present disclosure, a material of the transparent structural layer includes glass.

For example, in the sounding device provided by an embodiment of the present disclosure, each of the sounding units further includes: a bonding layer located between the base film and the transparent structural layer and configured to bond the base film and the transparent structural layer.

For example, in the sounding device provided by an embodiment of the present disclosure, the at least two sounding units include a first sounding unit and a second sounding unit; the sounding device further includes: a driver configured to drive the first sounding unit to generate an ultrasonic wave at a first frequency and to drive the second sounding unit to generate an ultrasonic wave at a second frequency; the ultrasonic wave at the first frequency and the ultrasonic wave at the second frequency are configured to have a nonlinear interaction and demodulate an audible sound.

For example, in the sounding device provided by an embodiment of the present disclosure, transparent structural layers of the at least two sounding units are formed as an integral transparent structural layer, and piezoelectric vibrating films of the at least two sounding units are arranged in an array on the integral transparent structural layer.

For example, in the sounding device provided by an embodiment of the present disclosure, first electrodes of the at least two sounding units are common electrodes, or, second electrodes of the at least two sounding units are common electrodes.

For example, in the sounding device provided by an embodiment of the present disclosure, the at least one piezoelectric structure includes a plurality of piezoelectric structures arranged in lamination; among adjacent two of the piezoelectric structures, the first electrode of one piezoelectric structure away from the transparent structural layer serves as the second electrode of the other piezoelectric structure close to the transparent structural layer.

For example, in the sounding device provided by an embodiment of the present disclosure, each of the sounding units further includes: an insulating layer located between the first electrode and the piezoelectric material layer.

For example, in the sounding device provided by an embodiment of the present disclosure, a material of the first electrode and the second electrode includes a transparent conductive material.

For example, in the sounding device provided by an embodiment of the present disclosure, a material of the piezoelectric material layer includes at least one of polyvinylidene difluoride (PVDF), aluminium nitride (AlN) and lithium niobate (LiNbO$_3$).

For example, the sounding device provided by an embodiment of the present disclosure further includes: a protecting film located on a side of the piezoelectric vibrating film away from the transparent structural layer.

For example, in the sounding device provided by an embodiment of the present disclosure, the recess penetrates the transparent structural layer in a direction perpendicular to the transparent structural layer.

At least one embodiment of the present disclosure provides a display device, including the sounding device described in any of the foregoing.

For example, the display device provided by an embodiment of the present disclosure further includes a display panel including a display region; an orthographic projection of the sounding device on the display panel is at least partly overlapped with the display region.

For example, in the display device provided by an embodiment of the present disclosure, an area of the orthographic projection of the sounding device on the display panel that is overlapped with the display region is 30%-100% of an area of the display region.

At least one embodiment of the present disclosure provides a manufacturing method of a sounding device, including: forming a transparent structural layer, the transparent structural layer including a recess and a supporting member located around the recess; forming a piezoelectric vibrating film, the piezoelectric vibrating film including a base film and at least one piezoelectric structure, each of the at least one piezoelectric structure including a first electrode, a piezoelectric material layer and a second electrode which are sequentially laminated; and covering the recess with the piezoelectric vibrating film, and forming a cavity by the piezoelectric vibrating film and the supporting member; the base film covers the recess; and the at least one piezoelectric structure is located on a side of the cavity away from the transparent structural layer.

For example, in the manufacturing method of the sounding device provided by an embodiment of the present disclosure, forming the transparent structural layer includes: providing a glass substrate; forming a mask material layer on the glass substrate; patterning the mask material layer to form a mask pattern including a plurality of via holes; and etching the glass substrate by using the mask pattern as a mask to form a plurality of recesses on the glass substrate corresponding to the plurality of via holes respectively so as to obtain the transparent structural layer.

For example, in the manufacturing method of the sounding device provided by an embodiment of the present disclosure, etching the glass substrate by using the mask pattern as a mask to form a plurality of recesses on the glass substrate corresponding to the plurality of via holes respectively so as to obtain the transparent structural layer includes: etching the glass substrate by using hydrofluoric acid to form a plurality of recesses on the glass substrate corresponding to the plurality of via holes respectively.

For example, in the manufacturing method of the sounding device provided by an embodiment of the present disclosure, covering the recess with the piezoelectric vibrating film and forming a cavity by the piezoelectric vibrating film and the supporting member includes: coating a bonding layer onto a side of the base film of the piezoelectric vibrating film away from the piezoelectric structure; aligning the piezoelectric vibrating film, on which the bonding layer is coated, with the transparent structural layer so that an orthographic projection of the first electrode on the transparent structural layer is at least partly overlapped with an orthographic projection of the recess on the transparent structural layer; and applying a pressure onto the piezoelectric vibrating film to bond the piezoelectric vibrating film with the transparent structural layer, so that the piezoelectric vibrating film covers the recess, and a cavity is formed by the piezoelectric vibrating film and the supporting member.

BRIEF DESCRIPTION OF THE DRAWINGS

In order to clearly illustrate the technical solutions of the embodiments of the present disclosure, the drawings of the embodiments will be briefly described in the following. Apparently, the described embodiments just relate to a part of the embodiments of the present disclosure without limiting the present disclosure thereto.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A conventional sounding device has a relatively huge volume and needs to be exposed from a surface of a display device so as to transmit a sound wave to the outside. As a result, the sounding device also gets in the way of further increasing a screen-to-body ratio of the display device. Therefore, inventor(s) of the present application conceives of designing a transparent sounding device with small volume, which can be integrated with the display device, so as to further increase the screen-to-body ratio of the display device.

Embodiments of the present disclosure provide a sounding device, a manufacturing method thereof and a display device. The sounding device includes at least two sounding units. Each of the sounding units includes: a transparent structural layer including a recess and a supporting member located around the recess; and a piezoelectric vibrating film, the piezoelectric vibrating film covers the recess, and a cavity is formed by the piezoelectric vibrating film and the supporting member. The piezoelectric vibrating film includes a base film covering the recess; and at least one piezoelectric structure located on a side of the cavity away from the transparent structural layer. Each of the at least one piezoelectric structure includes: a first electrode located on a side of the cavity away from the transparent structural layer; a piezoelectric material layer located on a side of the first electrode away from the cavity; and a second electrode located on a side of the piezoelectric material layer away from the first electrode. In this way, a suspension membrane structure can be formed by the piezoelectric vibrating film at a position where the cavity is located; in such case, the piezoelectric material layer in the piezoelectric structure can vibrate under a drive of the first electrode and the second electrode, so as to generate a sound wave. Because the sounding device is a membrane structure and the transparent structural layer is a transparent structure, the sounding device can be implemented as a thin and light, transparent sounding device, so as to be integrated in the display device. Moreover, the sounding device can also be at least partly disposed in a display region of the display device without affecting a normal display of the display device, so as to further increase the screen-to-body ratio of the display device. On the other hand, because the sounding device can be at least partly disposed in the display region of the display device, it can have relatively large area and hence can be provided with more sounding units, thereby realizing sounding effects such as directional sound and surround sound, and achieving relatively great sound pressure.

Hereinafter, the sounding device, the manufacturing method thereof and the display device provided by the embodiments of the present disclosure will be described in conjunction with the drawings.

Figure 1:
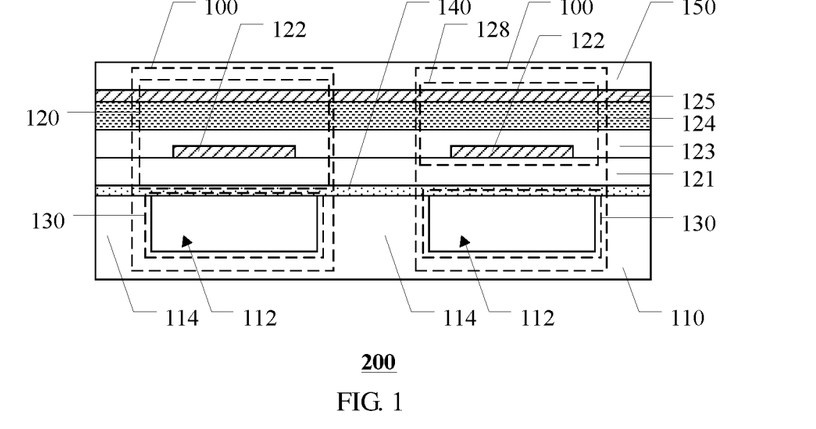
FIG. 1 illustrates a sounding device provided by an embodiment of the present disclosure.

An embodiment of the present disclosure provides a sounding device. FIG. 1 illustrates a sounding device provided by an embodiment of the present disclosure. As illustrated in FIG. 1, the sounding device 200 includes at least two sounding units 100. Each of the sounding units 100 includes: a transparent structural layer 110 including a recess 112 and a supporting member 114 located around the recess 112; and a piezoelectric vibrating film 120, the piezoelectric vibrating film 120 covers the recess 112, and a cavity 130 is formed by the piezoelectric vibrating film 120 and the supporting member 114. The piezoelectric vibrating film 120 includes a base film 121 covering the recess 112; and at least one piezoelectric structure 128 located on a side of the cavity 130 away from the transparent structural layer 110, that is, located on a side of the base film 121 away from the recess 112. The sounding device illustrated in FIG. 1 includes only one piezoelectric structure 128, but the piezoelectric vibrating film 120 can include a plurality of piezoelectric structures 128 arranged in lamination. Each of the at least one piezoelectric structure 128 includes: a first electrode 122 located on a side of the cavity 130 away from the transparent structural layer 110, that is, located on a side of the base film 121 away from the recess 112; a piezoelectric material layer 124 located on a side of the first electrode 122 away from the cavity 130, that is, located on a side of the first electrode 122 away from the base film 121; and a second electrode 125 located on a side of the piezoelectric material layer 124 away from the first electrode 122. It should be explained that, the supporting member 114 of the transparent structural layer 110 as mentioned above can be the remaining portion of a flat plate after forming the recess 112 (e.g., by etching process) in a flat plate. Moreover, although FIG. 1 illustrates two sounding units, the sounding device provided by the embodiment of the present disclosure can include more sounding units.

In the sounding device provided by the embodiment of the present disclosure, a suspension membrane structure can be formed by the piezoelectric vibrating film at a position where the cavity is located; in such case, the piezoelectric material layer in the piezoelectric structure can vibrate under a drive of the first electrode and the second electrode so as to generate a sound wave. Because the sounding device is a membrane structure and the transparent structural layer is a transparent structure, the sounding device is implemented as a thin and light, transparent sounding device, so as to be integrated in the display device. Moreover, the sounding device can also be at least partly disposed in a display region of the display device without affecting a normal display of the display device, so as to further increase the screen-to-body ratio of the display device and narrow a border of the display device. On the other hand, because the sounding device can be at least partly disposed in the display region of the display device, it can have relatively large area. On one aspect, the sounding device can be provided with more sounding units so as to constitute an array of sounding units, thereby realizing sounding effects such as directional sound and surround sound; on the other aspect, because the sounding device can have relatively large area, it can achieve relatively great sound pressure. It should be explained that, the base film can serve as an elastic layer of the piezoelectric structure, so as to restrict a radial deformation of the piezoelectric structure and increase a flexural vibration effect of the piezoelectric structure, that is, to increase an emission efficiency of the sounding device.

For instance, in some examples, the sounding device has a size greater than 4 inches. Because the sounding device is a membrane structure, it has a small size in a thickness direction. The size as mentioned above refers to an area of the sounding device, that is, the area of the sounding device is greater than 4 inches. Of course, the present disclosure includes such case but is not limited thereto, and the size of the sounding device can also be smaller than 4 inches.

For example, the size of the sounding device is greater than 8 inches, so as to have relatively great sound pressure. For another example, the size of the sounding device is greater than 12 inches.

For instance, in some examples, a material of the first electrode 122 and the second electrode 125 includes a transparent conductive material, for example, indium tin oxide (ITO). In this way, the sounding device can have relatively high light transmittance. Of course, the present disclosure includes such case but is not limited thereto, and the first electrode and the second electrode can also be made by adopting a metal material such as aluminum (Al), copper (Cu) and silver (Ag). In the case where the first electrode and the second electrode are made of a metal material, they can be made into metal meshes to improve the light transmittance.

For instance, in some examples, a material of the piezoelectric material layer 124 can include at least one of polyvinylidene fluoride (PVDF), aluminium nitride (AlN) and lithium niobate (LiNbO$_3$). Of course, the present disclosure includes such case but is not limited thereto, and the material of the piezoelectric material layer 124 can also adopt other piezoelectric materials.

For instance, in some examples, a material of the base film 121 can adopt a transparent organic material, for example, polyimide. Of course, the present disclosure includes such case but is not limited thereto, and the material of the base film 121 can also adopt other transparent materials.

For instance, in some examples, as illustrated in FIG. 1, an orthographic projection of the first electrode 122 on the transparent structural layer 110 is at least partly overlapped with an orthographic projection of the recess 112 on the transparent structural layer 110, so as for the first electrode 122 and the second electrode 125 to drive the piezoelectric material layer 124 to vibrate and generate a sound.

For instance, in some examples, as illustrated in FIG. 1, the orthographic projection of the first electrode 122 on the transparent structural layer 110 falls within the orthographic projection of the recess 112 on the transparent structural layer 110.

For instance, in some examples, as illustrated in FIG. 1, a material of the transparent structural layer 110 can be glass; that is to say, the transparent structural layer 110 can be made by adopting a glass substrate. Because the glass substrate can have relatively large size, a sounding device having relatively large size (area) can be manufactured, so that the sounding device can achieve relatively great sound pressure. Moreover, because the glass substrate have relatively great hardness, a stability of the cavity can be ensured, so as to ensure a stable sounding and allow for better stability of the sounding device during long term usage. On the other aspect, the glass substrate involves low cost, and can be manufactured by utilizing the equipment and the technical process for manufacturing the LCD panel, so as to reduce a manufacturing cost of the sounding device.

For instance, in some examples, as illustrated in FIG. 1, in the sounding device, the transparent structural layers of the above-mentioned at least two sounding units can be formed as an integral transparent structural layer; that is to say, the above-mentioned at least two sounding units can share a same transparent structural layer.

For instance, in some examples, as illustrated in FIG. 1, in the sounding device, the transparent structural layers of the above-mentioned at least two sounding units can be formed as an integral transparent structural layer, and the piezoelectric vibrating films of the at least two sounding units are arranged on the integral transparent structural layer.

For instance, in some examples, a size of the integral transparent structural layer is greater than 4 inches.

For example, the size of the integral transparent structural layer is greater than 8 inches, so as to achieve greater sound pressure. For another example, the size of the integral transparent structural layer is greater than 12 inches.

For instance, in some examples, as illustrated in FIG. 1, in the sounding device, the piezoelectric material layers of the above-mentioned at least two sounding units can be one and the same piezoelectric material layer; that is to say, the above-mentioned at least two sounding units can share a same piezoelectric material layer.

For instance, in some examples, as illustrated in FIG. 1, in the sounding device, the second electrodes of the above-mentioned at least two sounding units can be one and the same electrode layer; that is to say, the second electrodes of the above-mentioned at least two sounding units can share a same electrode layer; i.e., the second electrode is a common electrode. Of course, the present disclosure includes such case but is not limited thereto, and it's also possible that the first electrodes of the above-mentioned at least two sounding units can be one and the same electrode layer; that is to say, the first electrodes of the above-mentioned at least two sounding units can share a same electrode layer; i.e., the first electrode is a common electrode.

For instance, in some examples, as illustrated in FIG. 1, each of the sounding units 100 further includes a bonding layer 140 which is located between the base film 121 and the transparent structural layer 110 and is configured to bond the base film 121 with the transparent structural layer 110. For example, the base film 121 is bonded onto the supporting member 114 of the transparent structural layer 110.

For instance, in some examples, a thickness of the bonding layer 140 is in the range of 8-12 μm, e.g., 10 μm, so as to prevent from any influence to the vibration.

For instance, in some examples, as illustrated in FIG. 1, each of the sounding units 100 further includes an insulating layer 123 which is located between the first electrode 122 and the piezoelectric material layer 124 and serves for insulating. Of course, the present disclosure includes such case but is not limited thereto, and each of the sounding units may not include the insulating layer.

For instance, in some examples, as illustrated in FIG. 1, each of the sounding units 100 further includes a protecting film 150 which is located on a side of the piezoelectric vibrating film 120 away from the transparent structural layer 110, so as to play a role of protecting the piezoelectric vibrating film 120.

For instance, in some examples, as illustrated in FIG. 1, the recess 112 does not penetrate the transparent structural layer 110 in a direction perpendicular to the transparent structural layer 110, so as to improve the strength of the transparent structural layer 110. Of course, the present disclosure includes such case but is not limited thereto.

Figure 2:
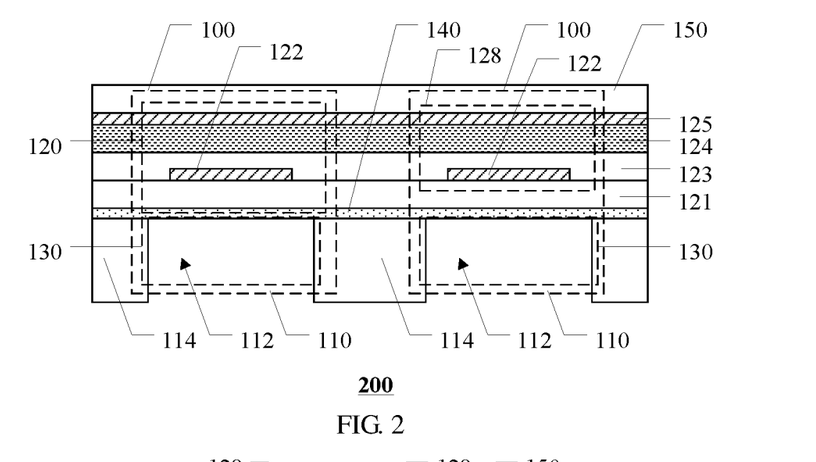
FIG. 2 is a structural diagram of another sounding device provided by an embodiment of the present disclosure.

FIG. 2 is a structural diagram of another sounding device provided by an embodiment of the present disclosure. As illustrated in FIG. 2, in the transparent structural layer 110, the recess 112 penetrates the transparent structural layer 110 in the direction perpendicular to the transparent structural layer 110. That is to say, the recess 112 in FIG. 1 is a blind hole formed in the transparent structural layer 110, while the recess 112 in FIG. 2 is a through hole formed in the transparent structural layer 110.

Figure 3:
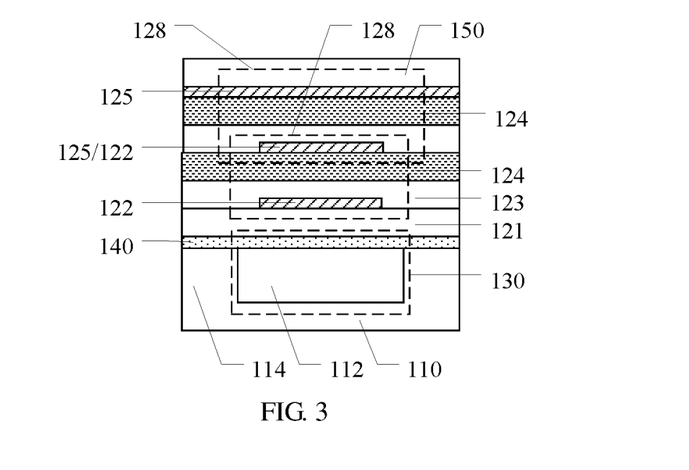
FIG. 3 is a structural diagram of another sounding device provided by an embodiment of the present disclosure.

FIG. 3 is a structural diagram of another sounding device provided by an embodiment of the present disclosure. For purpose of concision, FIG. 3 illustrates only one sounding unit 100. As illustrated in FIG. 3, the at least one piezoelectric structure 128 includes a plurality of piezoelectric structures 128 arranged in lamination; and for adjacent two piezoelectric structures 128, the first electrode 122 of one piezoelectric structure 128 away from the transparent structural layer 110 serves as the second electrode 125 of the other piezoelectric structure 128 close to the transparent structural layer 110. That is to say, a plurality of piezoelectric structures arranged in lamination is consisted of alternately arranged electrodes and piezoelectric material layers.

Figure 4:
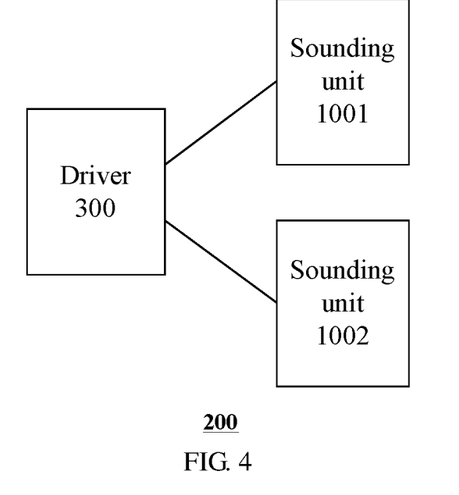
FIG. 4 is a schematic diagram of a sounding device provided by an embodiment of the present disclosure.

FIG. 4 is a schematic diagram of a sounding device provided by an embodiment of the present disclosure. As illustrated in FIG. 4, at least two sounding units 100 include a first sounding unit 1001 and a second sounding unit 1002; and the sounding device further includes a driver 300, which is configured to drive the first sounding unit 1001 to generate an ultrasonic wave at a first frequency and to drive the second sounding unit 1002 to generate an ultrasonic wave at a second frequency; the ultrasonic wave at the first frequency and the ultrasonic wave at the second frequency are configured to have a nonlinear interaction and to demodulate an audible sound having a frequency in the range of 20-20000 Hz. For example, the sounding device can utilize acoustic parametric array technology to perform a signal process to an acoustic signal and then load the acoustic signal onto the above-mentioned ultrasonic wave at the first frequency and ultrasonic wave at the second frequency; the ultrasonic wave at the first frequency and ultrasonic wave at the second frequency have a nonlinear interaction in the air and then demodulate an audible sound (difference frequency wave).

For instance, in some examples, the driver 300 is further configured to process the acoustic signal, modulate the acoustic signal into two ultrasonic wave signals, amplify the two ultrasonic wave signals, perform an impedance match and then apply the amplified, two ultrasonic wave signals onto the first sounding unit and the second sounding unit, respectively.

Figure 5:
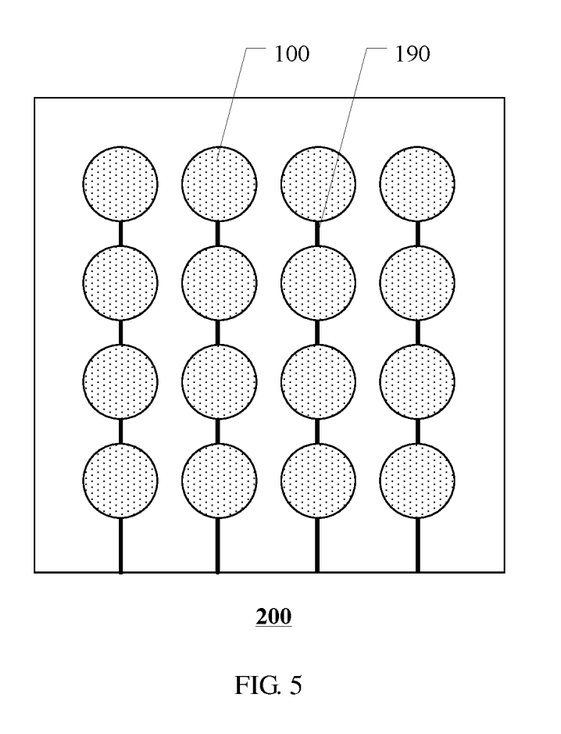
FIG. 5 is a plan view of a sounding device provided by an embodiment of the present disclosure.

FIG. 5 is a plan view of a sounding device provided by an embodiment of the present disclosure. As illustrated in FIG. 5, at least two sounding units 100 are arranged in an array, so as to obtain a directional sound having smaller angle and longer distance by utilizing the acoustic parametric array technology.

For instance, in some examples, as illustrated in FIG. 5, each of the sounding units 100 has a plane shape of circular, and a radius of the circular is in the range of 0.5 mm-2 mm. Of course, the present disclosure includes such case but is not limited thereto, and the shape and size of each of the sounding units can be configured according to actual conditions.

Figure 6:
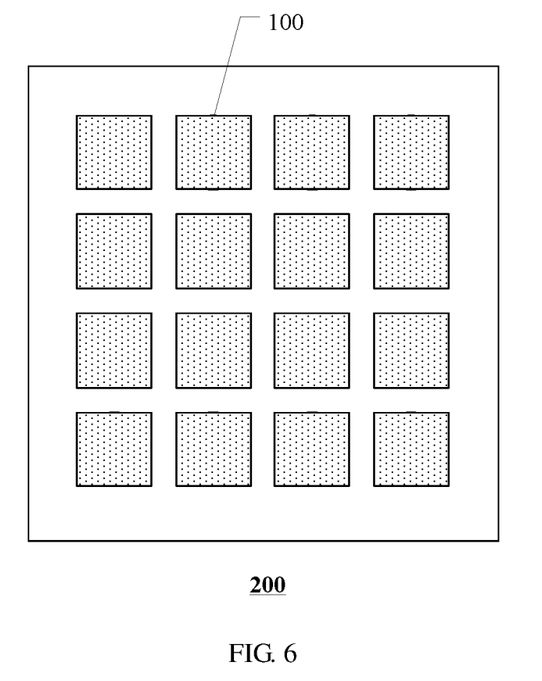
FIG. 6 is a plan view of another sounding device provided by an embodiment of the present disclosure.

FIG. 6 is a plan view of another sounding device provided by an embodiment of the present disclosure. As illustrated in FIG. 6, a plurality of sounding units 100 is arranged in an array, and each of the sounding units 100 has a plane shape of rectangle. The plurality of sounding units 100 can be separately driven by a lead 190. Of course, the present disclosure includes such case but is not limited thereto, and the plurality of sounding units 100 can be scanned and driven row by row, or, column by column.

Figure 7:
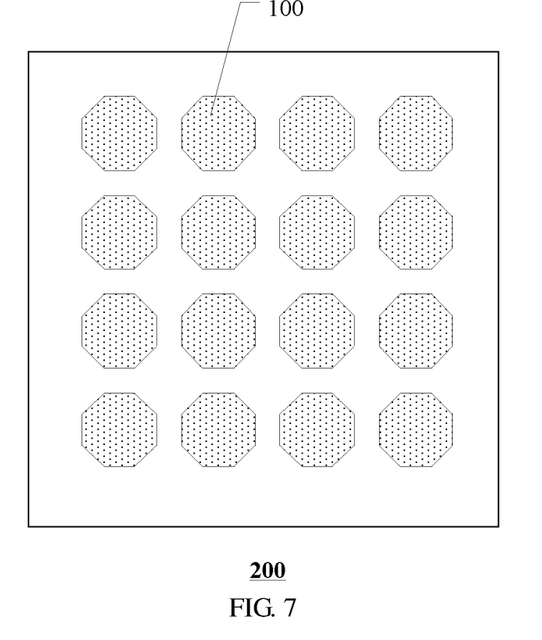
FIG. 7 is a plan view of another sounding device provided by an embodiment of the present disclosure.

FIG. 7 is a plan view of another sounding device provided by an embodiment of the present disclosure. As illustrated in FIG. 7, a plurality of sounding units 100 is arranged in an array, and each of the sounding units 100 has a plane shape of octagon.

Figure 8:
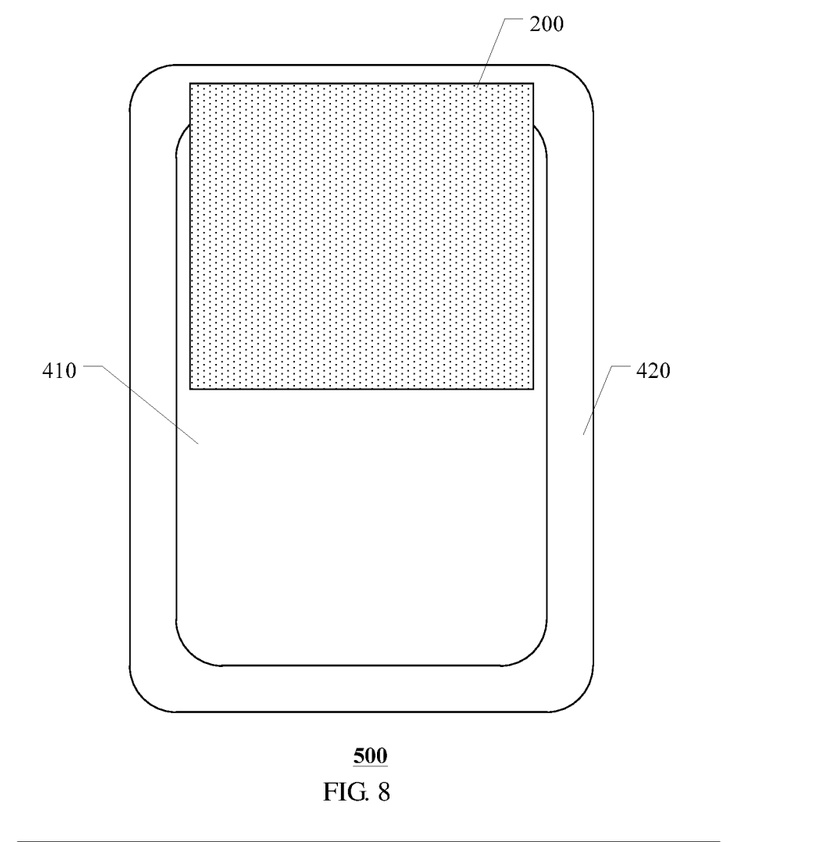
FIG. 8 is a schematic diagram of a display device provided by an embodiment of the present disclosure.

At least one embodiment of the present disclosure further provides a display device. FIG. 8 is a schematic diagram of a display device provided by an embodiment of the present disclosure. As illustrated in FIG. 8, the display device 500 includes any of the above-described sounding devices 200. In the display device provided by an embodiment of the present disclosure, because the sounding device is implemented as a light and thin, transparent sounding device and the sounding device can be at least partly disposed in a display region of the display device without affecting the normal display of the display device, the screen-to-body ratio of the display device can be further increased and the border of the display device can be narrowed. On the other hand, because the sounding device can be at least partly disposed in the display region of the display device, it can have relatively large area. On one aspect, the display device integrated with the sounding device can be formed with an array of sounding units, and hence can achieve sounding effects such as directional sound and surround sound; on the other aspect, because the sounding device can have relatively large area, the display device integrated with the sounding device can achieve relatively great sound pressure.

For example, as illustrated in FIG. 8, the display device 500 further includes a display panel 400 including a display region 410 and a periphery region 420 located around the display region 410. An orthographic projection of the sounding device 200 on the display panel 400 is at least partly overlapped with the display region 410. As compared with the conventional sounding device which can only be disposed in the periphery region, the sounding device 200 in the display device provided by the embodiment of the present disclosure can be partly disposed in the display region 410 of the display panel 400, and even can be entirely disposed in the display region 410 of the display panel 400, so as to reduce the area of the periphery region 420 and hence increase the area of the display region 410, thereby improving the screen-to-body ratio of the display device. Moreover, because the area of the display region 410 of the display panel 400 is much larger than the area of the periphery region 420, by arranging the sounding device 200 in the display region 410, the sounding device 200 is allowed to be made larger so as to achieve better sounding effects and greater sound pressure. Details may be referred to the related description in the foregoing embodiments.

For example, as illustrated in FIG. 8, an area of the orthographic projection of the sounding device 200 on the display panel 400 that is overlapped with the display region 410 is 30%-100% of an area of the display region 410.

For instance, in some examples, the display device 500 can be an electronic product having displaying function such as a mobile phone, a tablet computer, a notebook computer, a navigation device, a television, a digital photo frame, a smart watch and a smart bracelet.

Figure 9:
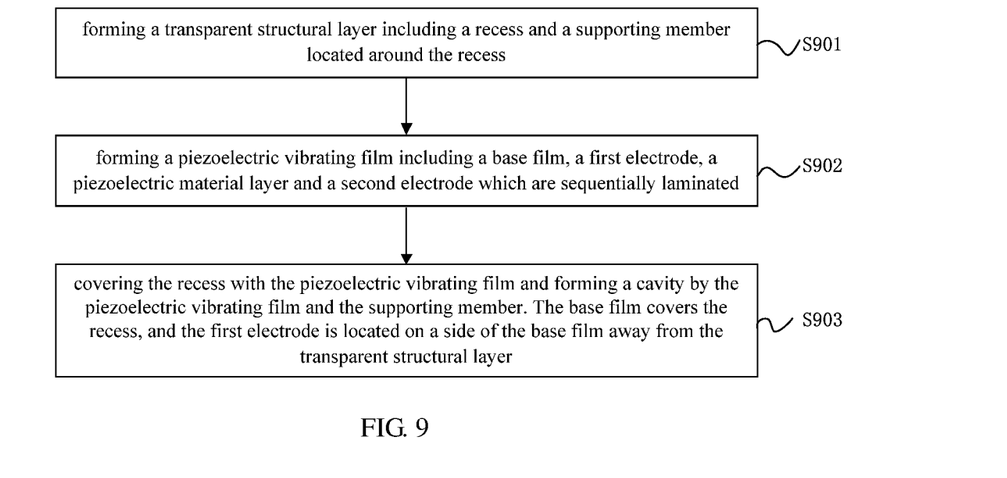
FIG. 9 is a flow chart of a manufacturing method of a sounding device provided by an embodiment of the present disclosure.

An embodiment of the present disclosure further includes a manufacturing method of a sounding device. FIG. 9 is a flow chart of a manufacturing method of a sounding device provided by an embodiment of the present disclosure. As illustrated in FIG. 9, the manufacturing method of the sounding device includes steps S901-S903.

Step S901: forming a transparent structural layer including a recess and a supporting member located around the recess.

Step S902: forming a piezoelectric vibrating film including a base film, a first electrode, a piezoelectric material layer and a second electrode which are sequentially laminated.

Step S903: covering the recess with the piezoelectric vibrating film and forming a cavity by the piezoelectric vibrating film and the supporting member. The base film covers the recess, and the first electrode is located on a side of the base film away from the transparent structural layer.

In the manufacturing method of the sounding device provided by the embodiment of the present disclosure, by forming the transparent structural layer and the piezoelectric vibrating film separately, instead of forming them simultaneously, it can simplify the manufacturing process of the sounding device and reduce the manufacturing cost. Moreover, because the sounding device obtained by the manufacturing method of the sounding device is a membrane structure and the transparent structural layer is a transparent structure, the manufacturing method of the sounding device can obtain a light and thin, transparent sounding device which is convenient to be integrated in a display device.

For instance, in some examples, the step of covering the recess with the piezoelectric vibrating film and forming a cavity by the piezoelectric vibrating film and the supporting member includes: coating a bonding layer onto a side of the base film of the piezoelectric vibrating film away from the piezoelectric structure; aligning the piezoelectric vibrating film, having coated with the bonding layer, with the transparent structural layer so that an orthographic projection of the first electrode on the transparent structural layer is at least partly overlapped with an orthographic projection of the recess on the transparent structural layer; and applying a pressure onto the piezoelectric vibrating film to bond the piezoelectric vibrating film with the transparent structural layer, so that the piezoelectric vibrating film covers the recess, and a cavity is formed by the piezoelectric vibrating film and the supporting member. In this way, the manufacturing method of the sounding device is simple and controllable.

Figure 10A:
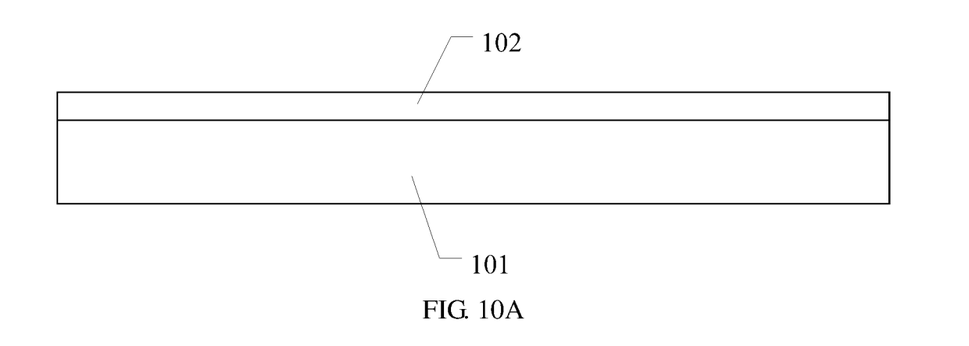
FIG. 10A-FIG. 10D are schematic diagrams illustrating a manufacturing method of a transparent structural layer provided by an embodiment of the present disclosure.
Figure 10B:
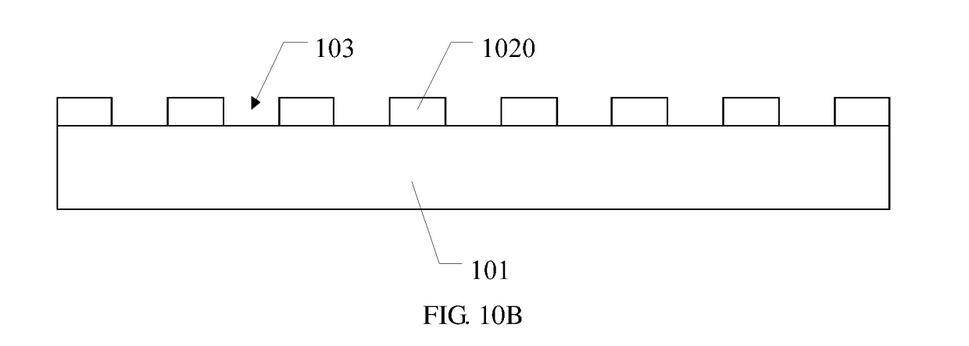
Figure 10C:
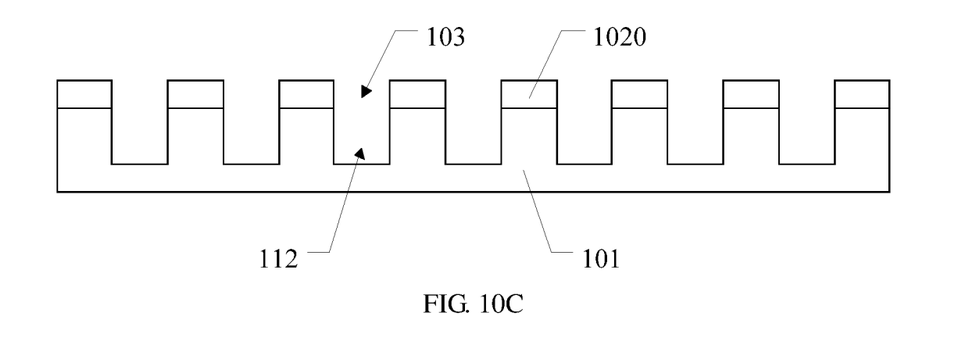

FIG. 10A-FIG. 10D are schematic diagrams illustrating a manufacturing method of a transparent structural layer provided by an embodiment of the present disclosure. As illustrated in FIG. 10A, providing a glass substrate 101; and forming a mask material layer 102 on the glass substrate 101. For example, a material of the mask material layer 102 can adopt a material which is not easy to be corroded by hydrofluoric acid. As illustrated in FIG. 10B, patterning the mask material layer 102 to form a mask pattern 1020 including a plurality of via holes 103. For example, the mask material layer 102 can be patterned by using a process such as photoetching and wet etching. In this way, the manufacturing method of the transparent structural layer can be performed by using a manufacturing device for a LCD panel. As illustrated in FIG. 10C, etching the glass substrate 101 by using the mask pattern 1020 as a mask, to form a plurality of recesses 112 on the glass substrate 101 corresponding to the plurality of via holes 103, respectively, so as to obtain the transparent structural layer 110. Of course, the present disclosure includes such case but is not limited thereto, and the recess 112 can also be formed on the glass substrate 101 by other ways such as laser boring.

Figure 10D:
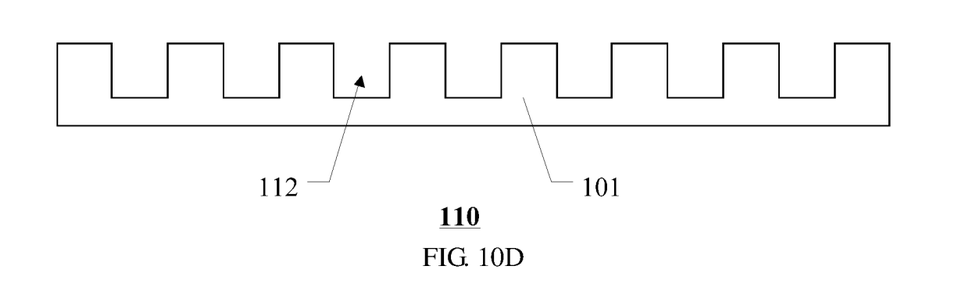

For instance, in some examples, as illustrated in FIG. 10D, the recess 112 in the transparent structural layer 110 does not penetrate the transparent structural layer 110, so that the transparent structural layer 110 has higher strength. Of course, the present disclosure includes such case but is not limited thereto.

For instance, in some examples, a material of the mask material layer 102 includes molybdenum (Mo).

For instance, in some examples, the step of etching the glass substrate by using the mask pattern as a mask to form a plurality of recesses on the glass substrate corresponding to the plurality of via holes respectively so as to obtain the transparent structural layer includes: etching the glass substrate by using hydrofluoric acid to form a plurality of recesses on the glass substrate corresponding to the plurality of via holes respectively.

Figure 10E:
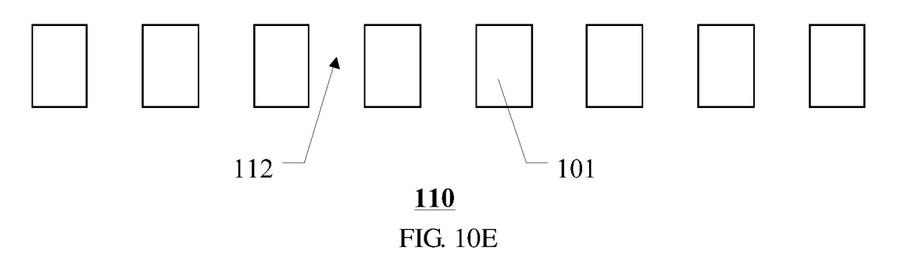
FIG. 10E is a schematic diagram of another transparent structural layer provided by an embodiment of the present disclosure.

FIG. 10E is a schematic diagram of another transparent structural layer provided by an embodiment of the present disclosure. As illustrated in FIG. 10E, the recess 110 penetrates the transparent structural layer 110 in a thickness direction of the transparent structural layer 110.

Figure 11A:
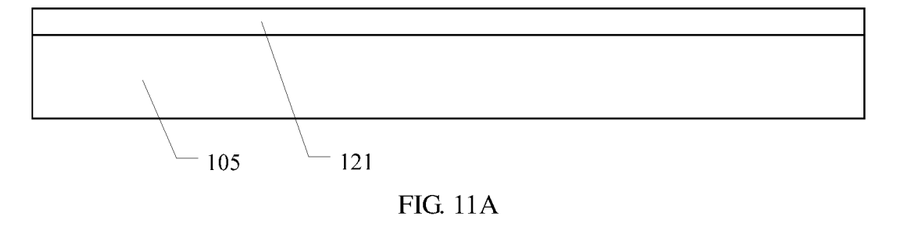
FIG. 11A-FIG. 11F are schematic diagrams illustrating steps of a manufacturing method of a piezoelectric vibrating film provided by an embodiment of the present disclosure.

FIG. 11A-FIG. 11F are schematic diagrams illustrating steps of a manufacturing method of a piezoelectric vibrating film provided by an embodiment of the present disclosure. As illustrated in FIG. 11A, forming a base film 121 on a glass base 105. For example, a material of the base film 121 can be polyimide, and the base film 121 can be formed on the glass base 105 by a spin coating process. On one aspect, the base film 121 can serve as a film which bears the piezoelectric structure, and serve as an elastic layer of the piezoelectric material layer or the piezoelectric structure so as to restrict the radial deformation and increase the flexural vibration effect, thereby increasing the emission efficiency of the amplifier. On the other aspect, the base film 121 can also play a role of protecting the piezoelectric structure in a subsequent process of removing the glass base 105.

Figure 11B:
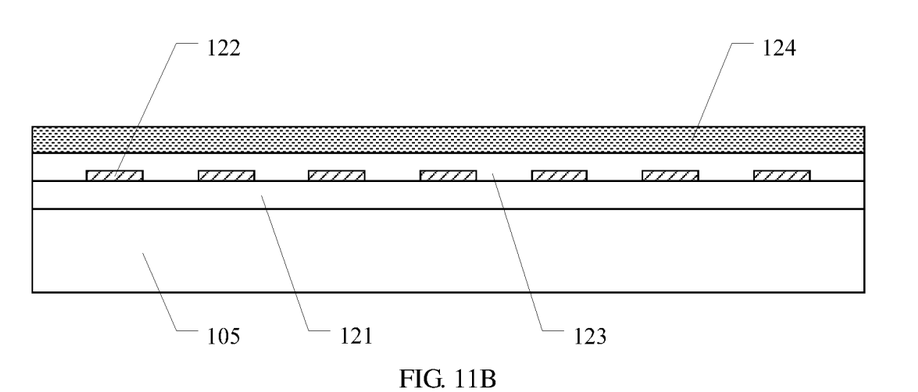

For example, as illustrated in FIG. 11B, depositing a first electrode 122, an insulating layer 123 and a piezoelectric material layer 124, in sequence, on the base film 121. A plurality of first electrodes 122 of a plurality of sounding units can be formed by patterning a same conductive film.

Figure 11C:
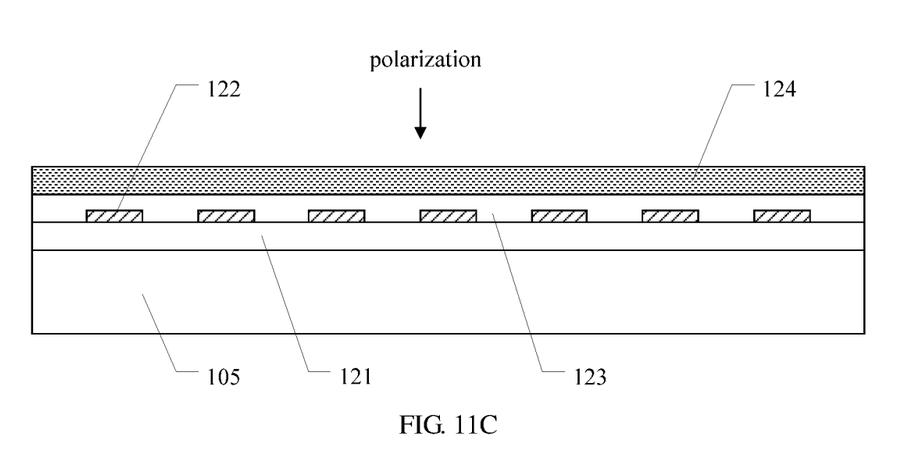
Figure 11D:
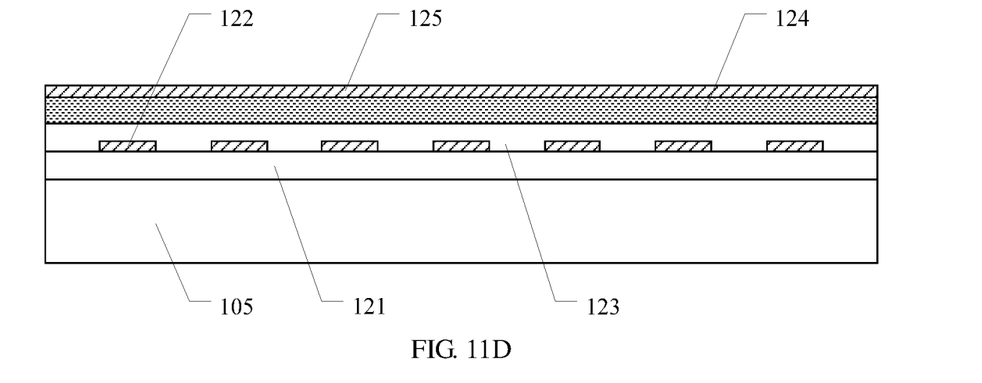

For example, as illustrated in FIG. 11C, polarizing the piezoelectric material layer 124, so as to improve a piezoelectric property of the piezoelectric material layer 124. For example, the piezoelectric material layer 124 can be placed, for polarization, in a corona discharge circumstance of a needle electrode which is applied with high voltage pressure and low current. At this moment, a strong electric field is generated on the electrically charged, piezoelectric material layer 124, and causes a stable directional alignment (alignment according to the direction of the electric field) of dipole chain under a certain temperature and a certain time, which results in permanent polarization and improves the piezoelectric property of the piezoelectric material layer 124. For example, a material of the piezoelectric material layer 124 can be PVDF. Of course, the present disclosure includes such case but is not limited thereto, and the piezoelectric material layer 124 may not be polarized if it has enough piezoelectric property. Moreover, a polarization process of the piezoelectric material layer 124 can also be selected according to actual conditions.

For example, as illustrated in FIG. 10D, forming a second electrode 125 at a side of the piezoelectric material layer 124 away from the first electrode 122. The first electrode 122, the piezoelectric material layer 124 and the second electrode 125 can constitute a piezoelectric structure 128. It should be explained that, each of the sounding units in the sounding device illustrated in FIGS. 11A-11F includes one piezoelectric structure 128. However, the present disclosure includes such case but is not limited thereto, and each of the sounding units in the sounding device can include a plurality of piezoelectric structures 128 arranged in lamination.

Figure 11E:
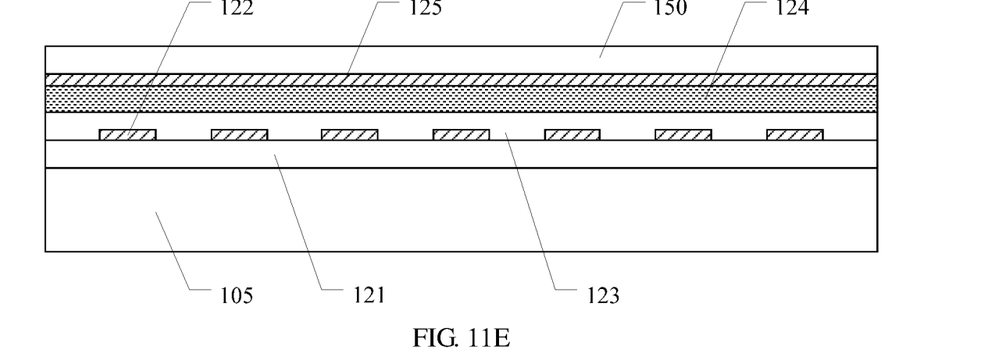

For example, as illustrated in FIG. 11E, forming a protecting film 150 at a side of the second electrode 125 away from the first electrode 122, so as to protect the piezoelectric structure 128.

Figure 11F:
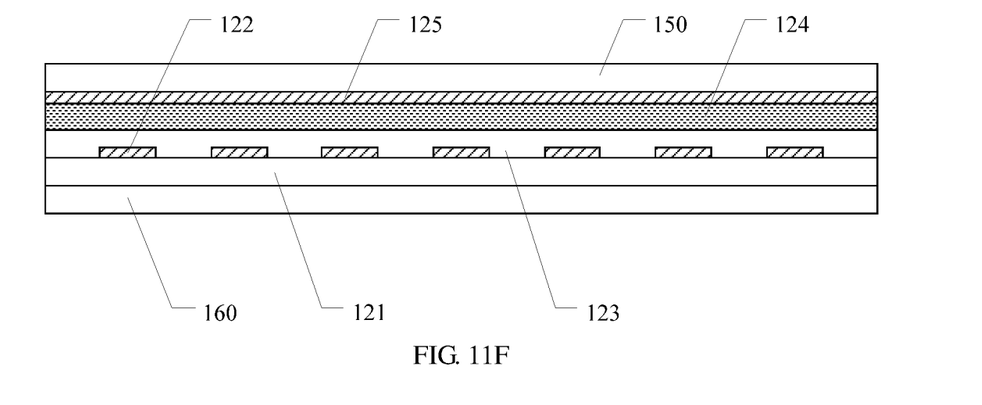

For example, as illustrated in FIG. 11F, removing the glass base 105, and forming a protecting film 160 at a side of the base film 121 away from the first electrode 122, so as to protect the piezoelectric structure 128.

Figure 12A:
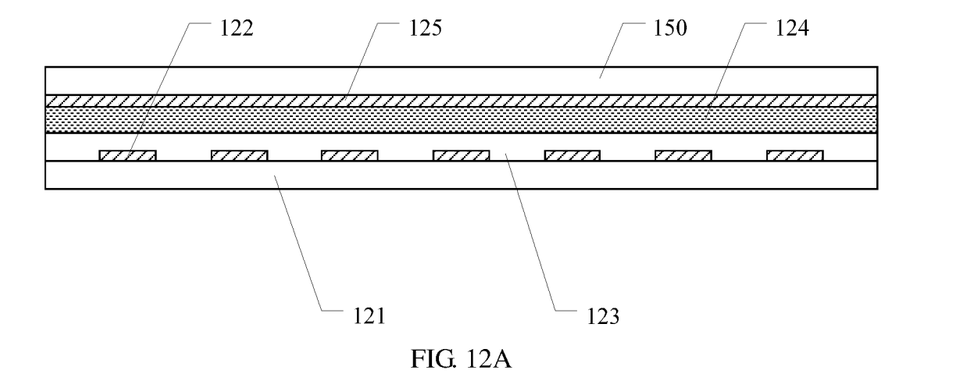
FIG. 12A-FIG. 12C are schematic diagrams illustrating steps of another manufacturing method of a sounding device provided by an embodiment of the present disclosure.
Figure 12B:
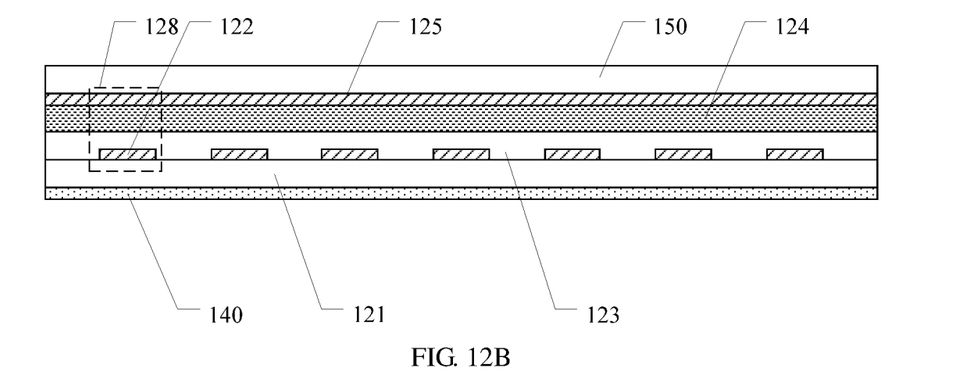
Figure 12C:
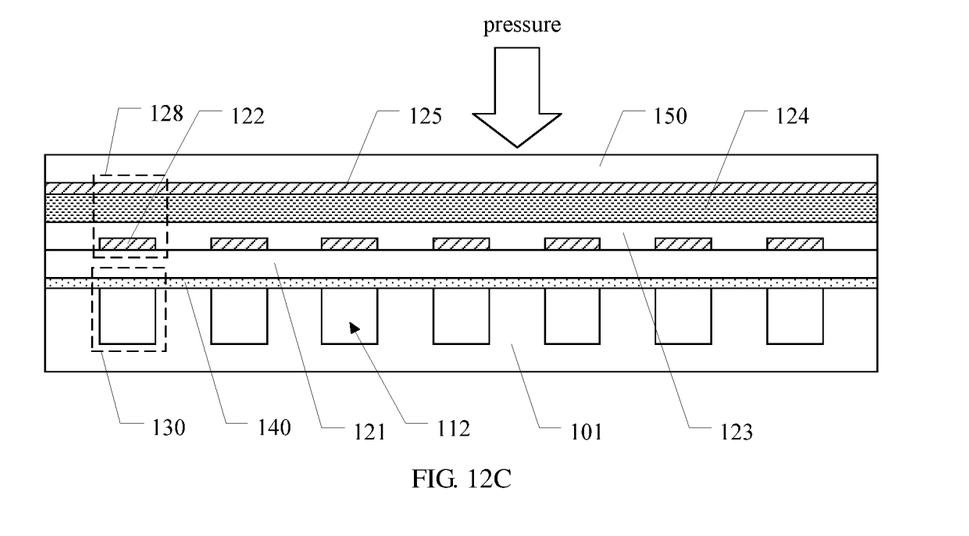

FIG. 12A-FIG. 12C are schematic diagrams illustrating steps of another manufacturing method of a sounding device provided by an embodiment of the present disclosure. As illustrated in FIG. 12A, removing the protecting film 160 of the piezoelectric vibrating film 120 illustrated in FIG. 11F. For example, the protecting film 160 can be uncovered under an ionic wind circumstance. As illustrated in FIG. 12B, attaching a bonding layer 140 onto a side of the base film 121 of the piezoelectric vibrating film 120 away from the piezoelectric structure 128. As illustrated in FIG. 12C, aligning the piezoelectric vibrating film 120, on which the bonding layer 140 is attached, with the transparent structural layer 110, so that an orthographic projection of the first electrode 122 on the transparent structural layer 110 is at least partly overlapped with an orthographic projection of the recess 112 on the transparent structural layer 110; and applying a pressure onto the piezoelectric vibrating film 120 to bond the piezoelectric vibrating film 120 with the transparent structural layer 110, so that the piezoelectric vibrating film 120 covers the recess 112, and a cavity 130 is formed by the piezoelectric vibrating film 120 and the supporting member 114. It should be explained that, the present disclosure includes such case but is not limited thereto, and the bonding layer 140 can also be attached onto the transparent structural layer 110 firstly, and then aligned and bonded with the piezoelectric vibrating film 120.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments of the present disclosure can be combined.

The above are only specific implementations of the present disclosure, and the protection scope of the present disclosure is not limited thereto. Any modifications or substitutions easily occur to those skilled in the art within the technical scope of the present disclosure should be fallen within the protection scope of the present disclosure. Therefore, the protection scope of the present disclosure should be based on the protection scope of the claims and the equivalents thereof.

What is claimed is:

1. A sounding device, comprising at least two sounding units, wherein each of the sounding units comprises:
    a transparent structural layer, comprising a recess and a supporting member located around the recess; and
    a piezoelectric vibrating film covering the recess, a cavity being formed by the piezoelectric vibrating film and the supporting member,
    wherein the piezoelectric vibrating film comprises a base film covering the recess and at least one piezoelectric structure located on a side of the base film away from the recess,
    each of the at least one piezoelectric structure comprises:
       a first electrode located on a side of the base film away from the recess; a piezoelectric material layer located on a side of the first electrode away from the cavity; and a second electrode located on a side of the piezoelectric material layer away from the first electrode,
    the at least one piezoelectric structure comprises a plurality of piezoelectric structures arranged in lamination, among adjacent two of the plurality of piezoelectric structures, the first electrode of one piezoelectric structure away from the transparent structural layer serves as the second electrode of the other piezoelectric structure close to the transparent structural layer.

2. The sounding device according to claim 1, wherein an orthographic projection of the first electrode on the transparent structural layer is at least partly overlapped with an orthographic projection of the recess on the transparent structural layer.

3. The sounding device according to claim 1, wherein a material of the transparent structural layer comprises glass.

4. The sounding device according to claim 1, wherein each of the sounding units further comprises:

a bonding layer located between the base film and the transparent structural layer and configured to bond the base film and the transparent structural layer.

5. The sounding device according to claim 1, wherein the at least two sounding units comprise a first sounding unit and a second sounding unit,
    the sounding device further comprises:
       a driver configured to drive the first sounding unit to generate an ultrasonic wave at a first frequency and to drive the second sounding unit to generate an ultrasonic wave at a second frequency,
       the ultrasonic wave at the first frequency and the ultrasonic wave at the second frequency are configured to have a nonlinear interaction and demodulate an audible sound.

6. The sounding device according to claim 1, wherein transparent structural layers of the at least two sounding units are formed as an integral transparent structural layer, and
    piezoelectric vibrating films of the at least two sounding units are arranged in an array on the integral transparent structural layer.

7. The sounding device according to claim 1, wherein first electrodes of the at least two sounding units are common electrodes, or,
    second electrodes of the at least two sounding units are common electrodes.

8. The sounding device according to claim 1, wherein each of the sounding units further comprises:
    an insulating layer located between the first electrode and the piezoelectric material layer.

9. The sounding device according to claim 1, wherein a material of the first electrode and the second electrode comprises a transparent conductive material.

10. The sounding device according to claim 1, wherein a material of the piezoelectric material layer comprises at least one of polyvinylidene difluoride (PVDF), aluminium nitride (AlN) and lithium niobate (LiNbO$_3$).

11. The sounding device according to claim 1, further comprising:
    a protecting film located on a side of the piezoelectric vibrating film away from the transparent structural layer.

12. The sounding device according to claim 1, wherein the recess penetrates the transparent structural layer in a direction perpendicular to the transparent structural layer.

13. A display device, comprising the sounding device according to claim 1.

14. The display device according to claim 13, further comprising:
    a display panel, comprising a display region,
    wherein an orthographic projection of the sounding device on the display panel is at least partly overlapped with the display region.

15. The display device according to claim 14, wherein an area of the orthographic projection of the sounding device on the display panel that is overlapped with the display region is 30%-100% of an area of the display region.

16. A manufacturing method of a sounding device, comprising:
    forming a transparent structural layer, the transparent structural layer comprising a recess and a supporting member located around the recess;
    forming a piezoelectric vibrating film, the piezoelectric vibrating film comprising a base film and at least one piezoelectric structure, each of the at least one piezoelectric structure comprising a first electrode, a piezoelectric material layer and a second electrode which are sequentially laminated; and covering the recess with the piezoelectric vibrating film, and forming a cavity by the piezoelectric vibrating film and the supporting member, wherein the base film covers the recess; and the at least one piezoelectric structure is located on a side of the base film away from the recess, forming the transparent structural layer comprises:

providing a glass substrate;

forming a mask material layer on the glass substrate;

patterning the mask material layer to form a mask pattern comprising a plurality of via holes; and etching the glass substrate by using the mask pattern as a mask to form a plurality of recesses on the glass substrate corresponding to the plurality of via holes respectively so as to obtain the transparent structural layer.

17. The manufacturing method of the sounding device according to claim 16, wherein etching the glass substrate by using the mask pattern as a mask to form the plurality of recesses on the glass substrate corresponding to the plurality of via holes respectively so as to obtain the transparent structural layer comprises:

etching the glass substrate by using hydrofluoric acid to form the plurality of recesses on the glass substrate corresponding to the plurality of via holes respectively.

18. A manufacturing method of a sounding device, comprising:

forming a transparent structural layer, the transparent structural layer comprising a recess and a supporting member located around the recess;

forming a piezoelectric vibrating film, the piezoelectric vibrating film comprising a base film and at least one piezoelectric structure, each of the at least one piezoelectric structure comprising a first electrode, a piezoelectric material layer and a second electrode which are sequentially laminated; and covering the recess with the piezoelectric vibrating film, and forming a cavity by the piezoelectric vibrating film and the supporting member, wherein the base film covers the recess; and the at least one piezoelectric structure is located on a side of the base film away from the recess, covering the recess with the piezoelectric vibrating film and forming the cavity by the piezoelectric vibrating film and the supporting member comprises:

coating a bonding layer onto a side of the base film of the piezoelectric vibrating film away from the piezoelectric structure;

aligning the piezoelectric vibrating film, on which the bonding layer is coated, with the transparent structural layer so that an orthographic projection of the first electrode on the transparent structural layer is at least partly overlapped with an orthographic projection of the recess on the transparent structural layer; and applying a pressure onto the piezoelectric vibrating film to bond the piezoelectric vibrating film with the transparent structural layer, so that the piezoelectric vibrating film covers the recess, and the cavity is formed by the piezoelectric vibrating film and the supporting member.

* * * * *